(12) United States Patent
Li et al.

(10) Patent No.: US 9,891,288 B2
(45) Date of Patent: *Feb. 13, 2018

(54) DEVICES AND METHODS FOR POWER TRANSMISSION LEVEL INDICATION

(71) Applicant: AT&T Intellectual Property I, L.P., Atlanta, GA (US)

(72) Inventors: Jian Li, Danville, CA (US); Zhi Li, San Ramon, CA (US); Raghvendra Savoor, Walnut Creek, CA (US)

(73) Assignee: AT&T Intellectual Property I, L.P., Atlanta, GA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/430,804

(22) Filed: Feb. 13, 2017

(65) Prior Publication Data

US 2017/0153293 A1    Jun. 1, 2017

Related U.S. Application Data

(63) Continuation of application No. 14/753,082, filed on Jun. 29, 2015, now Pat. No. 9,568,554, which is a
(Continued)

(51) Int. Cl.
*H04B 7/185* (2006.01)
*G01R 31/36* (2006.01)
(Continued)

(52) U.S. Cl.
CPC ..... *G01R 31/3689* (2013.01); *G01R 31/3624* (2013.01); *G01R 31/3648* (2013.01);
(Continued)

(58) Field of Classification Search
CPC ............ G01R 31/3689; G01R 31/3624; G01R 31/3648; H04W 52/0261; G08B 3/10; G08B 8/10
See application file for complete search history.

(56) References Cited

U.S. PATENT DOCUMENTS 4,890,332 A    12/1989  Takahashi
5,333,176 A     7/1994  Burke et al.
(Continued)

FOREIGN PATENT DOCUMENTS

WO    WO 2004091697    10/2004

OTHER PUBLICATIONS

U.S. Office Action dated Jul. 18, 2011 in U.S. Appl. No. 12/332,245.
(Continued)

*Primary Examiner* — Maharishi Khirodhar
(74) *Attorney, Agent, or Firm* — Hartman & Citrin LLC

(57) ABSTRACT

Devices and methods are disclosed which relate to a wireless communications device comprising a wireless power transmission detector and a wireless power transmission indicator for displaying to a user the current level of wireless power transmission. A voltmeter and ammeter take readings from the wireless transceiver circuit while the wireless communications device is on. A power logic stored on a memory within the wireless communications device converts the readings into a wireless power transmission level. The wireless power transmission level is output to an indicator on the wireless communications device where a user can view it. Exemplary embodiments include a true battery life indicator on the wireless communications device. The true battery life indicator gives an amount of time a battery powering the wireless communications device will last at the current wireless power transmission level.

20 Claims, 5 Drawing Sheets

Related U.S. Application Data continuation of application No. 12/332,245, filed on Dec. 10, 2008, now Pat. No. 9,071,696.

(51) Int. Cl.
   *G08B 3/10* (2006.01)
   *G08B 21/18* (2006.01)
   *H04W 52/02* (2009.01)

(52) U.S. Cl.
   CPC ............. *G08B 3/10* (2013.01); *G08B 21/182* (2013.01); *H04W 52/0261* (2013.01)

(56) References Cited

U.S. PATENT DOCUMENTS

| | | |
|---|---|---|
| 5,349,668 A | 9/1994 | Gladstein et al. |
| 6,087,808 A | 7/2000 | Pritchard |
| 6,127,933 A | 10/2000 | Ohmura et al. |
| 6,313,832 B1 | 11/2001 | Ishida |
| 6,314,308 B1 | 11/2001 | Sheynblat et al. |
| 6,433,512 B1 | 8/2002 | Birkler |
| 6,463,305 B1 | 10/2002 | Crane |
| 6,546,263 B1 | 4/2003 | Petty et al. |
| 7,289,166 B2 | 10/2007 | Kimura |
| 7,508,169 B2 | 3/2009 | Miskovic et al. |
| 7,870,410 B2 | 1/2011 | Hyatt |
| 9,071,696 B2 * | 6/2015 | Li ..................... H04M 1/72522 |
| 9,568,554 B2 * | 2/2017 | Li ..................... H04M 1/72522 |
| 2004/0046565 A1 | 3/2004 | Ingesson |
| 2004/0121799 A1 | 6/2004 | Chiou |
| 2005/0046390 A1 | 3/2005 | Kimura |
| 2005/0225295 A1 | 10/2005 | Sato |
| 2007/0164708 A1 | 7/2007 | Jiang |
| 2007/0226527 A1 | 9/2007 | Ang |
| 2009/0013204 A1 | 1/2009 | Kobayashi |

OTHER PUBLICATIONS

U.S. Office Action dated Jan. 4, 2012 in U.S. Appl. No. 12/332,245.
U.S. Office Action dated Jun. 11, 2012 in U.S. Appl. No. 12/332,245.
U.S. Office Action dated Aug. 13, 2014 in U.S. Appl. No. 12/332,245.
U.S. Office Action dated Nov. 24, 2014 in U.S. Appl. No. 12/332,245.
U.S. Notice of Allowance dated Feb. 26, 2015 in U.S. Appl. No. 12/332,245.
U.S. Office Action dated Apr. 1, 2016 in U.S. Appl. No. 14/753,082.
U.S. Notice of Allowance dated Sep. 29, 2016 in U.S. Appl. No. 14/753,082.

* cited by examiner

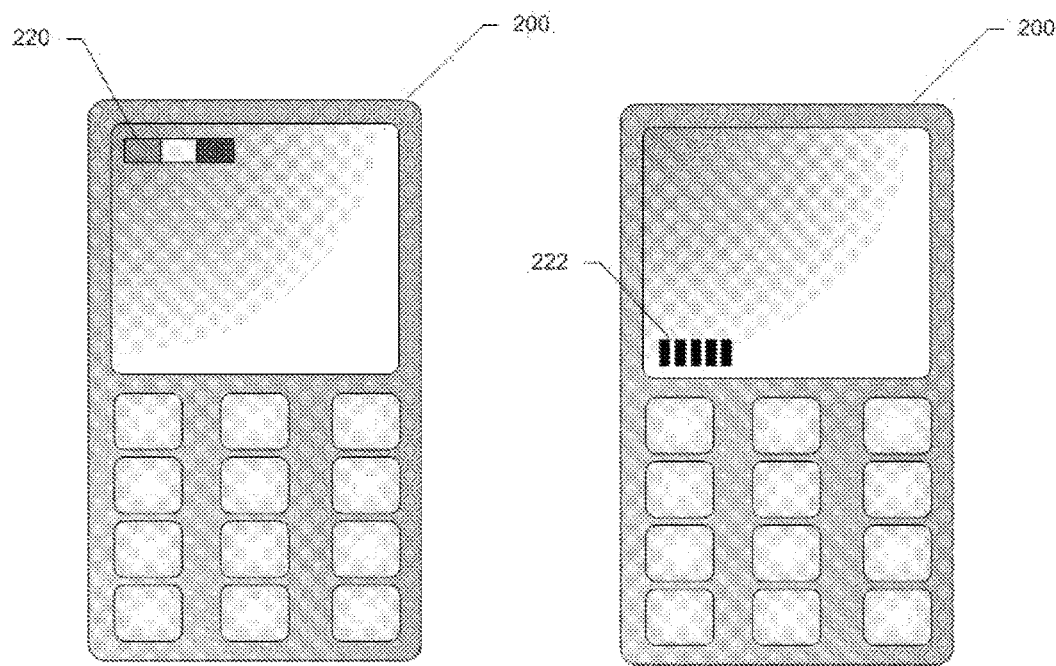
FIG. 2A
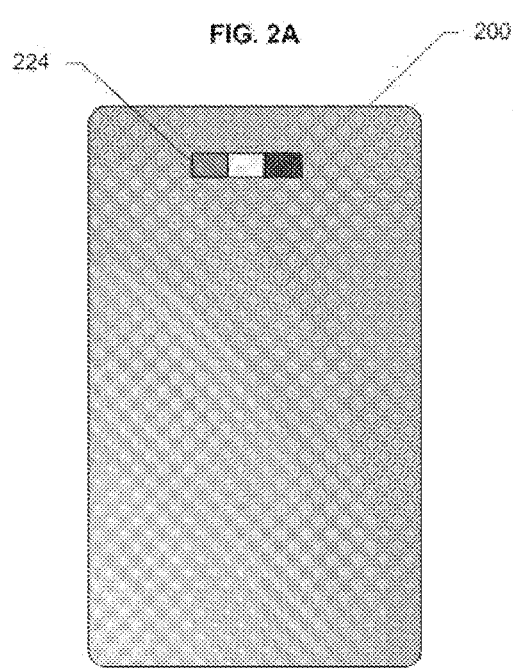
FIG. 2C
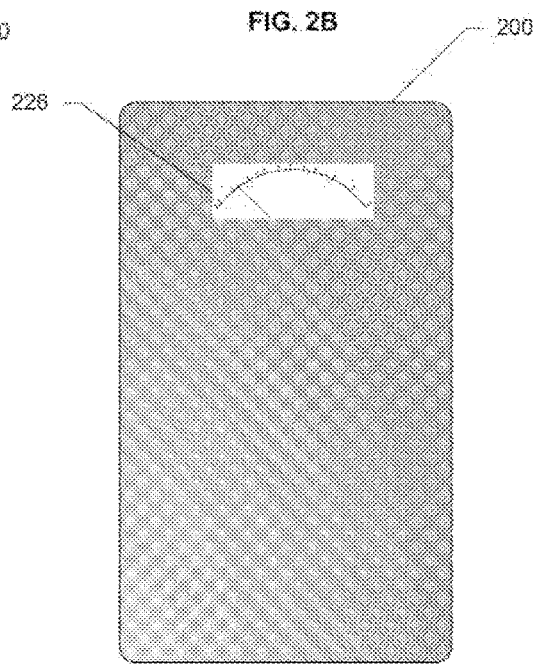
FIG. 2B
FIG. 2D

DEVICES AND METHODS FOR POWER TRANSMISSION LEVEL INDICATION

CROSS-REFERENCE TO RELATED APPLICATIONS

This application is a continuation of and claims priority to U.S. patent application Ser. No. 14/753,082, entitled "Devices and Methods for Power Transmission Level Indication," filed Jun. 29, 2015, now U.S. Pat. No. 9,568,554, which is incorporated herein by reference in its entirety; and which is a continuation of and claims priority to U.S. patent application Ser. No. 12/332,245, entitled "Devices and Methods for Power Transmission Level Indication," filed Dec. 10, 2008, now U.S. Pat. No. 9,071,696, which is incorporated herein by reference in its entirety.

BACKGROUND OF THE INVENTION

1. Field of the Invention

The present invention relates to wireless power transmission indication. More specifically the present invention relates to wireless power transmission indication in wireless communication devices.

2. Background of the Invention

Cellular telephones are tremendously popular. It is estimated that at the end of 2007 the total worldwide subscriber rate reached 3.3 billion. Close to 80% of the world's population enjoys mobile telephone coverage, a figure that will only increase. As cellular telephones gain popularity, their functionality has increased also. Standard service includes voice calling, caller ID, call waiting, and voice mail. Service providers also offer text messaging, push mail, navigation, and even a high-speed internet connection directly to telephones. Cellular phones frequently have cameras, with the resolution capabilities increasing with each new model. These cameras allow users to take pictures and videos.

Most cellular telephone models have at least two indicators on them. One of these indicators displays the amount of battery life, while the other indicator displays the amount of signal strength the cellular telephone is currently receiving. The battery life indicator shows an estimate of the amount of energy the battery contains. The battery life indicator can be a little confusing though, because cellular telephones do not constantly use the same amount of power. In fact, the power consumption greatly increases during a voice transmission than when at rest. The signal strength indicator displays an estimate of the quality of the signal the cellular telephone is currently receiving.

The power consumption by a cellular telephone increases during a voice transmission because the Radio Frequency (RF) transceiver goes from a rest state to a high-powered transmission level. The power transmission level varies during a voice transmission depending on the distance of the cellular telephone from the nearest cellular tower and the amount of environmental noise in between. "Environmental noise" refers to interference by electromagnetic waves, electronic devices, buildings, walls, etc. The quality of the voice transmission is measured by the cellular tower as well as most cellular telephones.

At the beginning of a voice transmission, the power transmission level is usually high, if not the highest. This ensures that the voice transmission will be clear at the beginning. The cellular tower measures the quality of the voice transmission and determines whether or not the power transmission level is too high. Since the power transmission level starts very high, if not the highest, it can usually be lowered to some extent. If this is the case, the cellular tower sends a message to the cellular telephone to lower the power transmission level within a few seconds after the voice transmission is initiated. Because the environment is constantly changing, the quality of the voice transmission is constantly monitored. If at any point it is determined that the voice quality is too low, then the cellular tower sends a message to the cellular telephone to raise the power transmission level.

The power transmission level has a direct relationship with the power consumption of the cellular telephone. Currently, there are fifteen different power transmission levels that network operators use. Most cellular telephone manufacturers give approximate battery life in terms of standby time and talk time. The talk time is usually a measure of how long the battery lasts at the highest power transmission level. In reality, the power transmission level can be lower than the highest power transmission level. This makes it hard for users to estimate how much talk time they have left.

A higher power transmission level also creates more electromagnetic radiation. Many people feel that they should closely monitor the amount of electromagnetic radiation they receive, especially around their head. Although studies on electromagnetic radiation from cellular telephones have been inconclusive so far, radiation in general has been linked to cancer. It may be many years before we know for sure what the effects are, but in the meantime, some people prefer to avoid exposure to radiation as a precaution.

What is needed in the art is a cellular telephone that indicates the instant power transmission level. With this knowledge cellular telephone users can more accurately estimate how much battery they are actually using. Users with low battery can determine whether or not to take a call based on the power transmission level. Users also can avoid voice calls that insist on using a high power transmission level while favoring voice calls that can use a lower power transmission level.

SUMMARY OF THE INVENTION

The present invention is a wireless communications device comprising a wireless power transmission detector and a wireless power transmission indicator for displaying to a user the current level of wireless power transmission. Exemplary embodiments include a voltmeter and an ammeter within the wireless communications device. The voltmeter and ammeter take readings from the wireless transceiver circuit while the wireless communications device is on. A power logic stored on a memory within the wireless communications device converts the readings into a wireless power transmission level. If multiple wireless transceivers are present, then the power logic adds the power from all of them to output the total wireless power transmission level. The wireless power transmission level is output to an indicator on the wireless communications device where a user can view the indicator. Users with a low battery or who are discomforted by high power transmission levels can avoid both by choosing to use the wireless communications device only when the power transmission level is low.

Furthermore, exemplary embodiments include a true battery life indicator on the wireless communications device. The true battery life indicator gives an amount of time a battery powering the wireless communications device will last at the current wireless power transmission level. The power transmission level and the energy remaining on the battery powering the wireless communications device is input to a true battery life logic on the memory unit. With this information the true battery life logic can calculate the amount of time the battery will last at the current power transmission level. Users can determine more accurately whether or not to discontinue using the wireless communications device depending on how much battery life is left and the time left on the current task.

In one embodiment, the present invention is a wireless communications device comprising a housing, a wireless transceiver coupled with the housing, a wireless power transmission detector within the housing and in communication with the wireless transceiver, a wireless power transmission indicator coupled with the housing and in communication with the wireless power transmission detector, and a memory unit within the housing and in communication with the wireless power transmission detector. The wireless power transmission detector detects a wireless power transmission level of the wireless transceiver which is displayed on the wireless power transmission indicator.

In another embodiment, the present invention is a wireless communications device comprising a housing, a wireless transceiver coupled with the housing, a voltmeter within the housing and in communication with the wireless transceiver, an ammeter within the housing and in communication with the wireless transceiver, a visual display coupled with the housing and in communication with the voltmeter and the ammeter, a memory unit within the housing and in communication with the voltmeter and ammeter, and a power logic on the memory unit. The power logic calculates a wireless power transmission level of the wireless transceiver which is displayed on the visual display.

In a further embodiment, the present invention is a method of displaying a wireless power transmission level on a wireless communications device having a wireless power transmission detector, comprising detecting a wireless power transmission level, and displaying the wireless power transmission level.

BRIEF DESCRIPTION OF THE DRAWINGS

FIG. 2A shows a wireless communications device with a multi-color wireless power transmission indicator on the display, according to an exemplary embodiment of the present invention.

FIG. 2B shows a wireless communications device with a multi-bar wireless power transmission indicator on the display, according to an exemplary embodiment of the present invention.

FIG. 2C shows a wireless communications device with a multi-color wireless power transmission indicator on the housing, according to an exemplary embodiment of the present invention.

FIG. 2D shows a wireless communications device with an analog wireless power transmission indicator on the housing, according to an exemplary embodiment of the present invention.

DETAILED DESCRIPTION OF THE INVENTION

The present invention is a wireless communications device comprising a wireless power transmission detector and a wireless power transmission indicator for displaying to a user the current level of wireless power transmission. Exemplary embodiments include a voltmeter and an ammeter within the wireless communications device. The voltmeter and ammeter take readings from the wireless transceiver circuit while the wireless communications device is on. A power logic stored on a memory within the wireless communications device converts the readings into a wireless power transmission level. If multiple wireless transceivers are present then the power logic adds the power from all of them to output the total wireless power transmission level. The wireless power transmission level is output to an indicator on the wireless communications device where a user can view it. Users with a low battery or who are discomforted by high power transmission levels can avoid them by choosing to use the wireless communications device only when the power transmission level is low.

Furthermore, exemplary embodiments include a true battery life indicator on the wireless communications device. The true battery life indicator gives an amount of time a battery powering the wireless communications device will last at the current wireless power transmission level. The power transmission level and the energy remaining on the battery powering the wireless communications device is input to a true battery life logic on the memory unit. With this information the true battery life logic can calculate the amount of time the battery will last at the current power transmission level. Users can determine more accurately whether or not to discontinue using the wireless communications device depending on how much battery life is left and the time left on the current task.

Definitions

"Wireless communications device," as used in this disclosure, refers to any device capable of sending or receiving waves to communicate with other devices. Examples of wireless communications devices are cellular telephones, computers, personal digital assistants (PDAs), or any other device that utilizes at least one form of wireless communication. Forms of wireless communication include RF, BLUETOOTH, WiFi, etc.

Figures 1A, 1B:
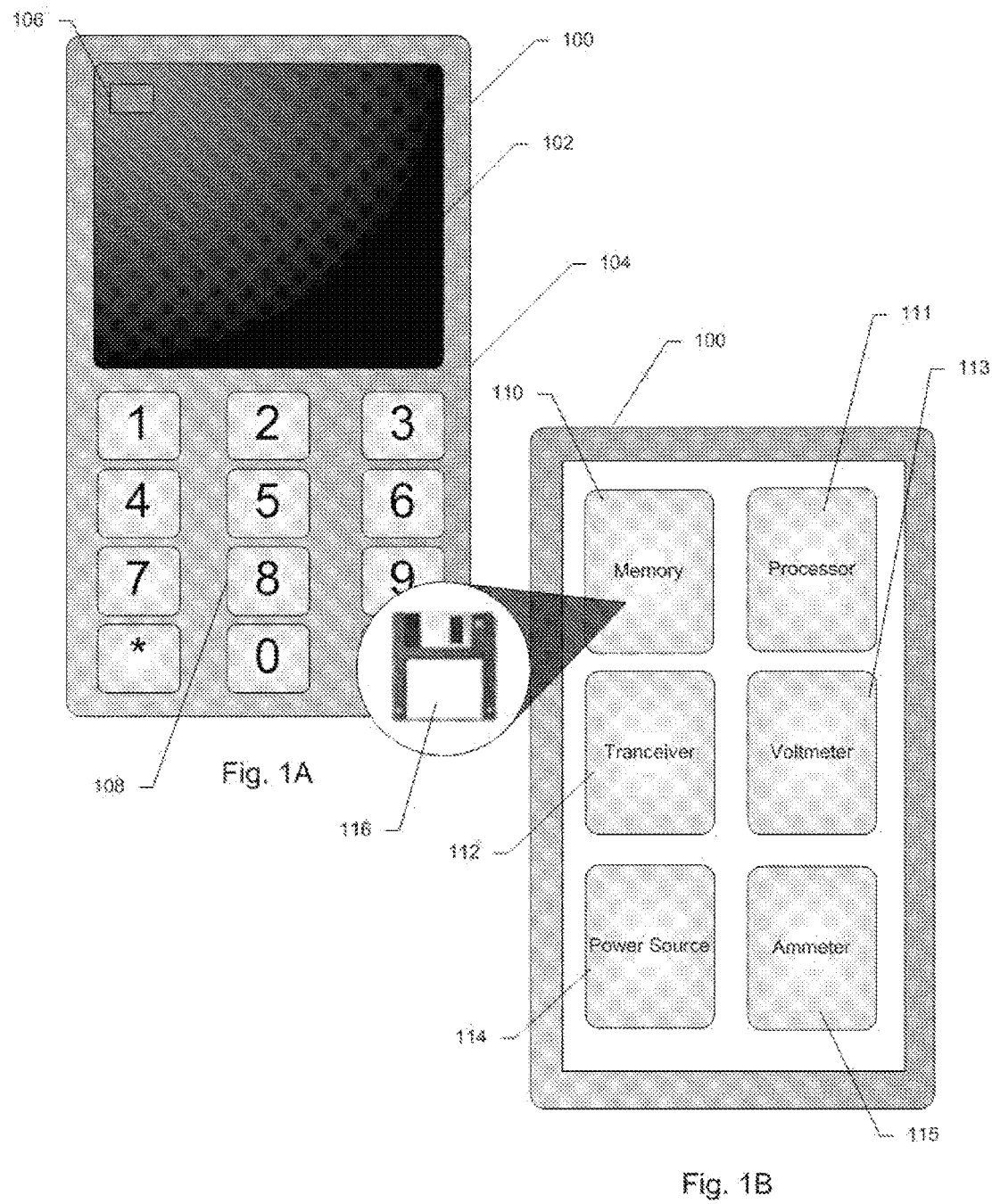
FIG. 1A shows a front view of a wireless communications device with a wireless power transmission indicator, according to an exemplary embodiment of the present invention.
FIG. 1B shows a view of components of a wireless communications device, according to an exemplary embodiment of the present invention.

FIGS. 1A and 1B show a wireless communications device with a wireless power transmission indicator, according to an exemplary embodiment of the present invention. FIG. 1A shows a front view of a wireless communications device 100 with a wireless power transmission indicator 106, according to an exemplary embodiment of the present invention. In this embodiment, the front of wireless communications device 100 comprises a housing 104, a display 102, a keypad 108, and a wireless power transmission indicator 106. The housing 104 is preferably composed of a rigid and durable material, such as plastic or metal, to hold the components in place and prevent the components from being damaged. The display 102 is coupled to the housing 104 and is used to view outputs of the wireless communications device 100. In exemplary embodiments of the present invention, the display 102 is a liquid crystal display (LCD). The keypad 108 allows a user to input numbers, input letters, select functions, play games, etc. The wireless power transmission indicator 106 notifies the user of the wireless communications device 100 of the instant wireless power transmission level of the wireless communications device 100. In the present embodiment, the wireless power transmission indicator 106 is shown as an icon in a corner of the display 102. Different icon colors may represent different power transmission levels. In alternative embodiments, bars or numbers can be used instead of or as well as colors. The user, once notified, may take actions to decrease the wireless power transmission level. This may be accomplished by going outside, moving to a different room, etc. By reducing the wireless power transmission level, the wireless communications device 100 utilizes less power and a battery of the wireless communications device 100 can last longer. Using a lower wireless power transmission level may also help to alleviate fears of radiation.

FIG. 1B shows a view of components of a wireless communications device 100, according to an exemplary embodiment of the present invention. In this embodiment, the components comprise a memory unit 110, a processor 111, a transceiver module 112, a power source 114, a voltmeter 113, an ammeter 115, and a power logic 116 on the memory unit 110. The memory unit 110 stores an operating system for the wireless communications device 100. The memory unit 110 additionally stores photos, music, games, telephone settings, telephone numbers, etc. The transceiver module 112 is utilized to communicate with wireless networks. This communication may use a cellular Radio Frequency (RF) connection, BLUETOOTH connection, WiFi connection, etc. The processor 111 runs the operating system of the wireless communications device 100 as well as other features and programs. The power source 114 provides power to each of the components of the wireless communications device 100. The voltmeter 113 measures the electrical potential between two points of the transceiver module 112 in order to measure voltage. The ammeter 115 measures the current in the circuit of the transceiver module 112. The power logic 116 on the memory unit 110 uses the results from the ammeter 115 and the voltmeter 113 to measure the wireless power transmission level of the wireless communications device 100. The transmission voltage and current are combined into the formula $$Power(P) = Current(I) \times Voltage(V).$$

The resulting wireless power transmission level is displayed to the user.

Exemplary embodiments of the wireless communications device 100, particularly cellular telephone embodiments, determine the wireless power transmission level from commands sent from a nearby cellular tower. Embodiments that receive this command do not require a voltmeter 113 or an ammeter 115 because the power logic 116 can simply read the wireless power transmission level from the latest command. These embodiments can have a voltmeter and ammeter for more accurate readings, or in case the command is not clear. These commands only control the wireless power transmission level of the cellular RF transceiver. Other wireless transceivers onboard these wireless communication devices require a voltmeter and an ammeter for wireless power transmission detection.

Other embodiments of the wireless communications device 100 feature multiple wireless transceivers. Multiple voltmeters and ammeters can be used to determine the total power transmission level of all the wireless transceivers of the wireless communications device 100. Certain wireless communications devices, such as laptop computers, have many wireless transceiver modules which may run at the same time. A total power transmission level is desirable for these embodiments. In some embodiments the power logic 116 may reside on a dedicated memory module to ensure there are sufficient resources to detect and indicate the wireless power transmission level. Other wireless communications devices contain speakers. For embodiments of these devices, an audible alert is given once the wireless power transmission indicator hits a specified level. This specified level is selected by the user within the operating system of a wireless communications device such as the wireless communications device 100. There are many embodiments of the wireless power transmission indicator. FIGS. 2A-2D show transmission power indicators, according to exemplary embodiments of the present invention.

FIG. 2A shows a wireless communications device 200 with a multi-color wireless power transmission indicator 220 on the display, according to an exemplary embodiment of the present invention. In this embodiment, each of the colors on the multi-color wireless power transmission indicator 220 represents a different wireless power transmission level. Green indicates that the wireless communications device 200 is transmitting at a low level, yellow indicates the wireless communications device 200 is transmitting at a moderate level, and red indicates the wireless communications device 200 is transmitting at a high level. A multi-color wireless power transmission indicator 220 may appear anywhere on the display, constantly or at the touch of a button. When using the multi-color wireless power transmission indicator 220, a user looking for a lower wireless power transmission level travels until the multi-color wireless power transmission indicator 220 turns green.

FIG. 2B shows a wireless communications device 200 with a multi-bar wireless power transmission indicator 222 on a display, according to an exemplary embodiment of the present invention. In this embodiment, the number of bars represents the wireless power transmission level. One bar represents a very low wireless power transmission level, while five bars represents a high wireless power transmission level. A user trying to minimize the wireless power transmission level travels to find an area where the number of bars is at its lowest.

FIG. 2C shows a wireless communications device 200 with a multi-color wireless power transmission indicator 224 on the housing, according to an exemplary embodiment of the present invention. In this embodiment, each of the colors on the multi-color wireless power transmission indicator 224 represents a different wireless power transmission level. Each of the colors of the multi-color wireless power transmission indicator 224 is a separate LED. Similar embodiments feature a single LED capable of emitting multiple colors of light. The multi-color wireless power transmission indicator 224 is located anywhere on the housing, allowing the user to glance at wireless power transmission indicator to see the wireless power transmission level at any time.

FIG. 2D shows a wireless communications device 200 with an analog wireless power transmission indicator 226 on the housing, according to an exemplary embodiment of the present invention. In this embodiment, a needle on the analog wireless power transmission indicator 226 displays the wireless power transmission level. This allows the user to glance at the analog wireless power transmission indicator 226 to see the exact wireless power transmission level. An analog indicator has the advantage of expressing the wireless power transmission level on a continuous scale. Digital embodiments, such as LEDs or bars, give the user one of three ranges that the wireless power transmission level is within, yet are not specific about the exact wireless power transmission level. Analog wireless power transmission indicator 226 can be located anywhere on the housing of the wireless communications device 200.

There are many other embodiments of the wireless power transmission indicator. Most cellular carriers utilize cellular telephones that operate on one of fifteen different wireless power transmission levels. An indicator showing exactly which of these fifteen levels the cellular telephone is operating at is beneficial for a cellular telephone. A device which has more than one wireless transceiver, especially those with concurrently operating transceivers, may benefit more from an analog indicator, or a digital indicator with more precision than a fifteen-level indicator.

Figure 3:
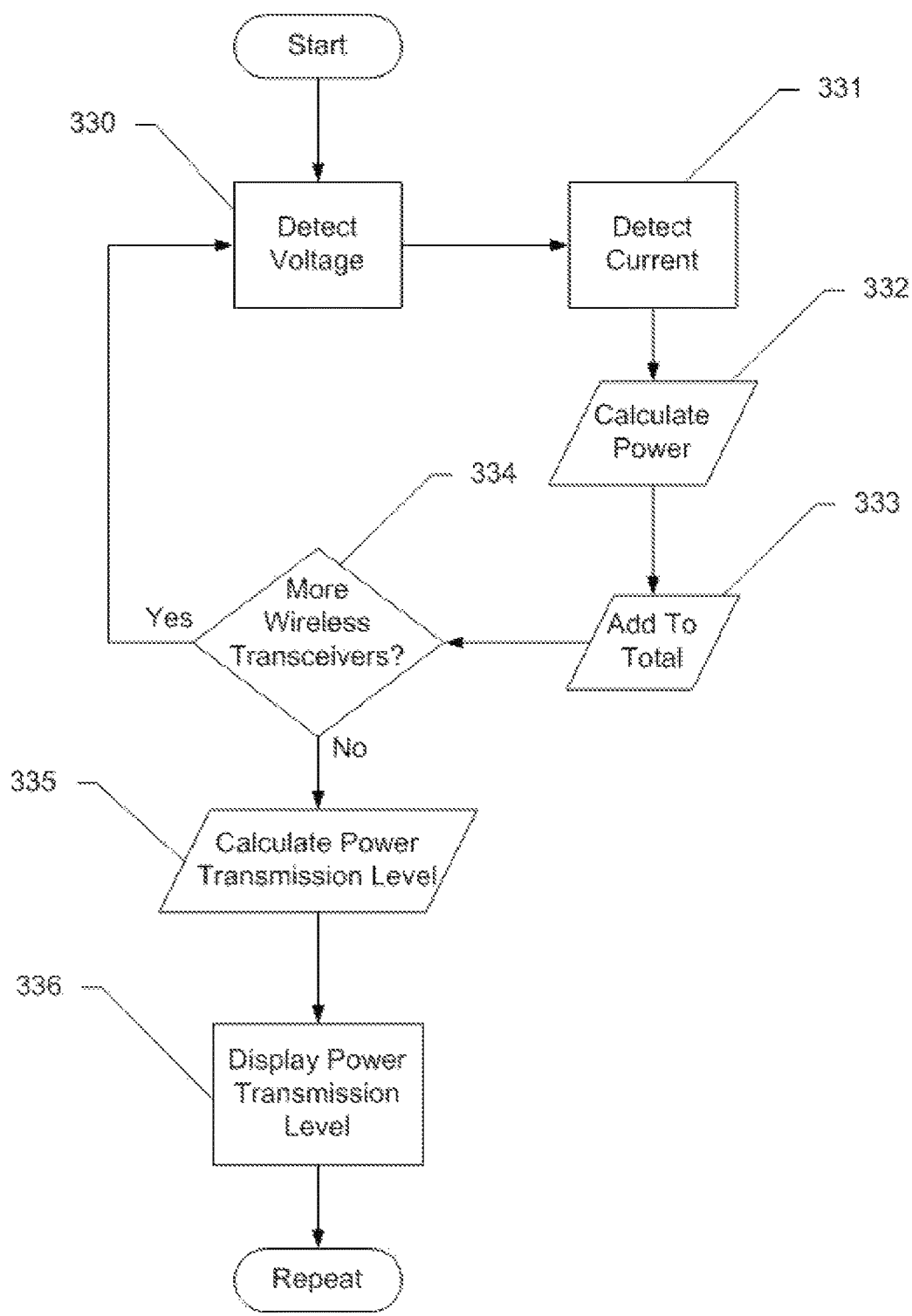
FIG. 3 shows a flowchart of a calculation and display of a wireless power transmission level, according to an exemplary embodiment of the present invention.

FIG. 3 shows a flowchart of a calculation and display of a wireless power transmission level, according to an exemplary embodiment of the present invention. In this embodiment, a voltmeter onboard a wireless communications device 100 detects a voltage 330 being used by a transceiver. An ammeter onboard the wireless communications device 100 detects a current 331 used by the transceiver. With the detected voltage 330 and current 331, a power logic unit onboard a memory unit of the wireless communications device 100 calculates a power 332 being used by the transceiver. The power logic unit accomplishes this using the formula:

$$\text{Power}(P) = \text{Current}(I) \times \text{Voltage}(V).$$

The power 332 from the wireless transceiver is added to a total wireless power transmission 333 which includes any other active transceivers onboard the wireless communications device 100. The method then queries whether there are any other wireless transceivers 334 onboard the wireless communications device 100.

If there are more transceivers, the method will cycle back to detect the voltage 330 and current 331 of each. The total power 332 of each subsequent transceiver is added together. When no more wireless transceivers are detected, the total power transmission level is calculated 335 by summing the wireless power transmission level of each transceiver. This power transmission level is displayed 336 on the wireless communications device 100 for the user to see.

The calculation process runs constantly in the background of the operating system of a wireless communications device such as the wireless communications device 100 or the wireless communications device 200. This gives the user constant updates as to the wireless power transmission level. This way the user knows that the wireless power transmission level indicated is a substantially instant reading. Instant readings give the user the ability to travel short distances and become immediately aware once the wireless power transmission level has lowered to an acceptable level.

Figure 4A:
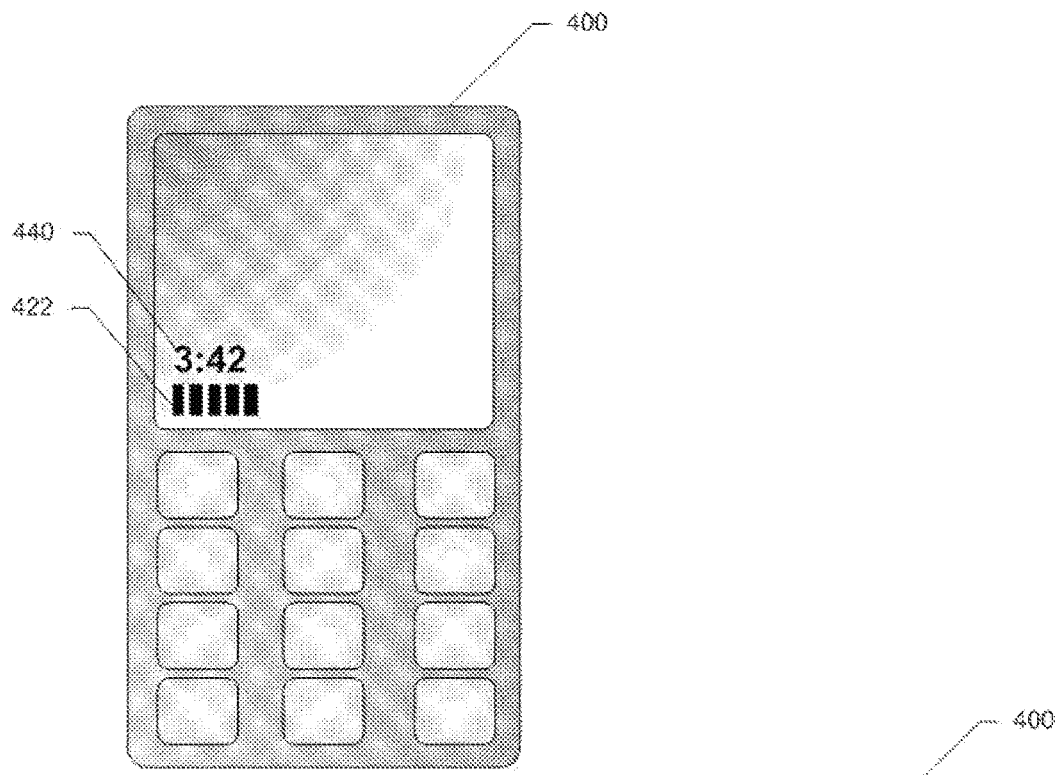
FIG. 4A shows a timer countdown true-life battery indicator, according to an exemplary embodiment of the present invention.
Figure 4B:
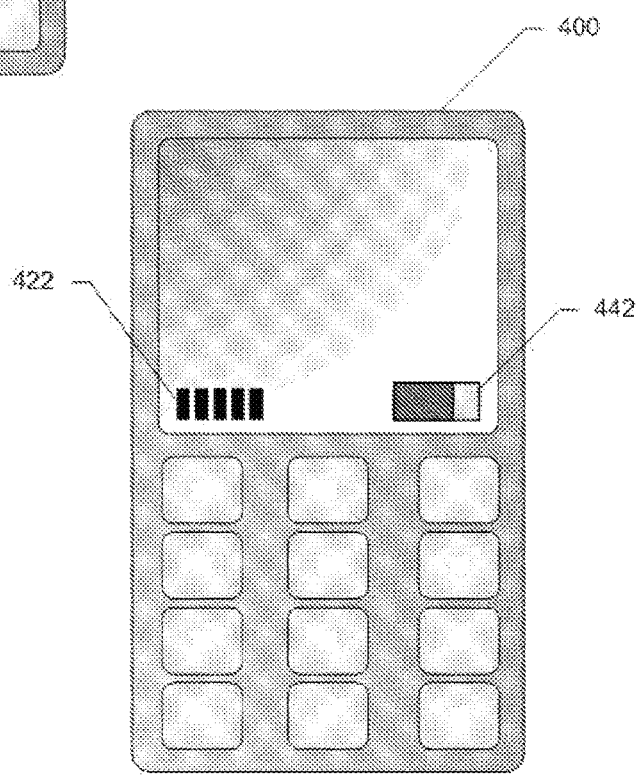
FIG. 4B shows a true-life battery indicator, according to an exemplary embodiment of the present invention.

FIGS. 4A and 4B illustrate wireless communications devices 400 with transmission power level indicators and true-life battery indicators, according to exemplary embodiments of the present invention.

FIG. 4A shows a timer countdown true-life battery indicator 440, according to an exemplary embodiment of the present invention. In this embodiment, a transmission power level indicator 422 and a timer countdown true-life battery indicator 440 are both located on a display 102 of the wireless communications device 400. The transmission power level indicator 422 shows the wireless power transmission level currently being utilized by wireless communications device 400. This level directly affects the life of the battery of the wireless communications device 400. The amount of time that this wireless power transmission level can be sustained by the wireless communications device 400 is shown by the timer countdown true-life battery indicator 440. The power logic 116, which also calculates the wireless power transmission level, reads the amount of energy left in the battery and calculates a time that the battery can last at the current wireless power transmission level using the formula:

$$\text{Time}(t) = \text{Energy}(e) / \text{Power}(P).$$

In this embodiment, the true-life battery indicator is shown as a countdown clock. The clock counts down the amount of time left before the transmission is dropped due to insufficient energy in the battery.

FIG. 4B shows a true-life battery indicator 442, according to an exemplary embodiment of the present invention. In this embodiment, the true-life battery indicator 442 is a graphical depiction of remaining battery time. A fully shaded rectangle represents a longer length of time than a rectangle with only a small shaded portion. The rectangle can be set to represent any period of time, with intervals set accordingly. The true-life battery indicator 442, like the transmission power level indicator 422, can take many forms.

Some wireless communications devices 400 are programmed to save everything and power down before a complete loss occurs with respect to the battery. For these devices the true-life battery indicator 442 displays the amount of time left until the device hits a critical battery level where the device will start to save and power down. Other devices simply turn off all wireless transceivers once the battery hits a critical level so that the user can stretch the remaining power 332 in the battery to power other functions of the device. This is particularly useful for PDAs since they also serve as calendars, address books, and store other useful information. The true-life battery indicator 442 displays the amount of time left until critical battery capacity on these devices as well. Other wireless communications devices 400 contain speakers. For embodiments of these devices, an audible alert is given once the true-life battery indicator 442 hits a specified time remaining. This specified time remaining is selected by the user within the operating system of the wireless communications device 400.

Figure 5:
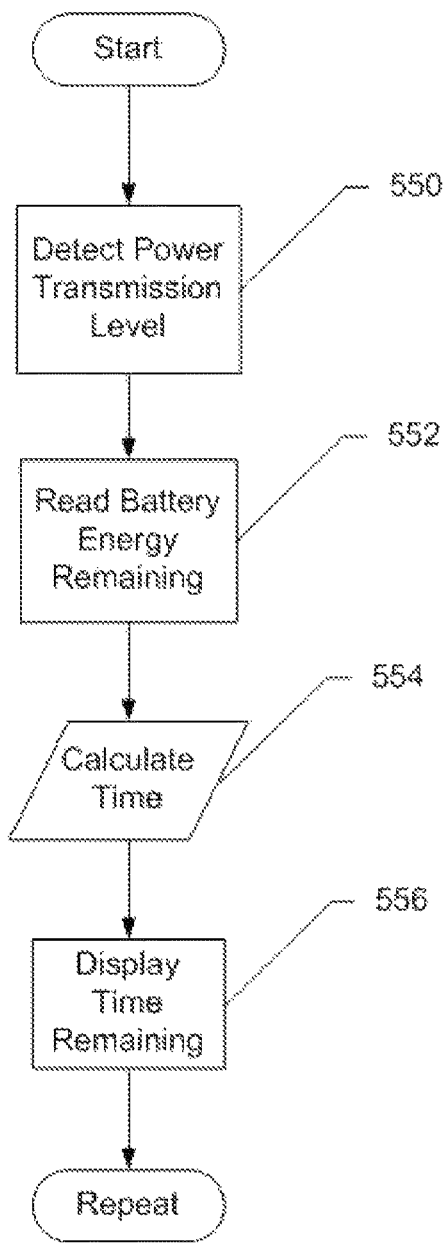
FIG. 5 shows a flowchart of a method of a true-life battery indicator onboard a wireless communications device, according to an exemplary embodiment of the present invention.

FIG. 5 shows a flowchart of a method of providing a true-life battery indicator 442 onboard a wireless communications device 100, according to an exemplary embodiment of the present invention. In this embodiment, the method first detects the wireless power transmission level 550. This is accomplished by using an ammeter 115 and voltmeter 113 onboard the wireless communications device 100 along with a power logic 116 on the memory unit 110 to make calculations. The power logic 116 then reads the amount of energy left in the battery 552 of the wireless communications device 100. With these two values, the power logic 116 calculates the amount of time the battery 552 will last 554 under the wireless power transmission level 550 currently being used by the wireless communications device 100. With the amount of time calculated, the wireless communications device 100 displays the battery time remaining 556 to the user. This lets the user know how long he can continue the transmission. The user decides if he can complete the task within the amount of time, and, if not, allows the user to seek a location yielding a lower wireless power transmission level 550. The wireless communications device 100 repeats the method to frequently update the battery time remaining.

The foregoing disclosure of the exemplary embodiments of the present invention has been presented for purposes of illustration and description. It is not intended to be exhaustive or to limit the invention to the precise forms disclosed. Many variations and modifications of the embodiments described herein will be apparent to one of ordinary skill in the art in light of the above disclosure. The scope of the invention is to be defined only by the claims appended hereto, and by their equivalents.

Further, in describing representative embodiments of the present invention, the specification may have presented the method and/or process of the present invention as a particular sequence of steps. However, to the extent that the method or process does not rely on the particular order of steps set forth herein, the method or process should not be limited to the particular sequence of steps described. As one of ordinary skill in the art would appreciate, other sequences of steps may be possible. Therefore, the particular order of the steps set forth in the specification should not be construed as limitations on the claims. In addition, the claims directed to the method and/or process of the present invention should not be limited to the performance of their steps in the order written, and one skilled in the art can readily appreciate that the sequences may be varied and still remain within the spirit and scope of the present invention.

The invention claimed is:

1. A cellular communication device comprising:
   a wireless transceiver;
   a display;
   a voltmeter connected to a wireless transceiver circuit that comprises the wireless transceiver;
   an ammeter connected to the wireless transceiver circuit that comprises the wireless transceiver;
   a battery connected to the wireless transceiver circuit;
   a processor; and
   a memory that stores computer-executable instructions that, when executed by the processor, cause the processor to perform operations comprising:
      obtaining a voltage reading measured for the wireless transceiver circuit, wherein the voltage reading is obtained using the voltmeter,
      obtaining a current reading measured for the wireless transceiver circuit, wherein the current reading is obtained using the ammeter,
      calculating, based upon the voltage reading and the current reading, a power transmission level of the cellular communication device,
      displaying, at the display, an indication of the power transmission level of the cellular communication device,
      determining an amount of energy remaining in the battery,
      calculating, based upon the power transmission level and the amount of energy remaining in the battery, an amount of time the battery will last at the power transmission level of the cellular communication device, and
      displaying the amount of time the battery will last at the display.

2. The cellular communication device of claim 1, wherein the amount of time the battery will last comprises an amount of time at the power transmission level until the battery reaches a critical battery level.

3. The cellular communication device of claim 1, wherein the display comprises a multi-color wireless power transmission indicator.

4. The cellular communication device of claim 1 wherein the amount of time the battery will last comprises an amount of time at the power transmission level until the wireless transceiver is deactivated.

5. The cellular communication device of claim 1, further comprising a speaker, wherein the computer-executable instructions, when executed by the processor, cause the processor to perform operations further comprising providing an audible alert via the speaker in response to the power transmission level reaching a maximum power transmission level.

6. A cellular communication device comprising:
   a wireless transceiver;
   a display;
   a voltmeter connected to a module that comprises the wireless transceiver;
   an ammeter connected to the module that comprises the wireless transceiver;
   a battery connected to the module;
   a processor; and
   a memory that stores computer-executable instructions that, when executed by the processor, cause the processor to perform operations comprising:
      obtaining a voltage reading measured for the module, wherein the voltage reading is obtained using the voltmeter,
      obtaining a current reading measured for the module, wherein the current reading is obtained using the ammeter,
      calculating, based upon the voltage reading and the current reading, a power transmission level of the cellular communication device,
      displaying, at the display, an indication of the power transmission level of the cellular communication device,
      determining an amount of energy remaining in the battery,
      calculating, based upon the power transmission level and the amount of energy remaining in the battery, an amount of time the battery will last at the power transmission level of the cellular communication device, and
      displaying the amount of time the battery will last at the display.

7. The cellular communication device of claim 6, wherein the amount of time the battery will last comprises an amount of time at the power transmission level until the battery reaches a critical battery level.

8. The cellular communication device of claim 6, wherein the display comprises a multi-color wireless power transmission level indicator.

9. The cellular communication device of claim 6, wherein the amount of time the battery will last comprises an amount of time at the power transmission level until the wireless transceiver will be deactivated.

10. The cellular communication device of claim 6, further comprising a speaker, wherein the computer-executable instructions, when executed by the processor, cause the processor to perform operations further comprising providing an audible alert via the speaker in response to the power transmission level reaching a maximum power transmission level.

11. The cellular communication device of claim 6, wherein displaying the amount of time comprises displaying an icon that represents the amount of time.

12. A method comprising:
obtaining, at a cellular communication device that comprises a processor, a wireless transceiver, a display, a voltmeter connected to a wireless transceiver circuit that comprises the wireless transceiver, an ammeter connected to the wireless transceiver circuit that comprises the wireless transceiver, and a battery connected to the wireless transceiver circuit, a voltage reading from the wireless transceiver circuit, wherein the voltage reading is obtained using the voltmeter;
obtaining, by the processor and using the ammeter, a current reading measured for the wireless transceiver circuit;
calculating, by the processor and based upon the voltage reading and the current reading, a power transmission level of the cellular communication device;
displaying, by the processor and at the display, an indication of the power transmission level of the cellular communication device;
determining, by the processor, an amount of energy remaining in the battery;
calculating, by the processor and based upon the power transmission level and the amount of energy remaining in the battery, an amount of time the battery will last at the power transmission level; and
displaying, by the processor and at the display, the amount of time the battery will last.

13. The method of claim 12, further comprising:
providing, using a speaker of the cellular communication device, an audible alert in response to the power transmission level reaching a maximum power transmission level.

14. The method of claim 12, wherein the display comprises a multi-color wireless power transmission level indicator.

15. The method of claim 14, wherein the amount of time the battery will last comprises an amount of time at the power transmission level until the wireless transceiver of the cellular communication device is deactivated.

16. The method of claim 12, wherein the current reading comprises a first current reading associated with a first wireless transceiver and a second current reading associated with a second wireless transceiver, and wherein the voltage reading comprises a first voltage reading associated with the first wireless transceiver and a second voltage reading associated with the second wireless transceiver.

17. The method of claim 16, wherein the first wireless transceiver comprises a cellular radiofrequency transceiver, and wherein the second wireless transceiver comprises a short range wireless transceiver.

18. The method of claim 17, wherein the power transmission level comprises a total power transmission level.

19. The method of claim 12, wherein the amount of time the battery will last comprises an amount of time at the power transmission level until the battery reaches a critical battery level.

20. The method of claim 19, wherein the critical battery level comprises a level at which the cellular communication device will save data and power down.

* * * * *